United States Patent [19]
Tyrrel

[11] 4,016,555
[45] Apr. 5, 1977

[54] SIGNAL CONVERTER

[76] Inventor: Sylvan F. Tyrrel, 443 Beverly Drive, Richardson, Tex. 75080

[22] Filed: Apr. 7, 1975

[21] Appl. No.: 565,869

[52] U.S. Cl. ........................................ 340/347 DA
[51] Int. Cl.² ...................................... H03K 13/05
[58] Field of Search ........................... 340/347 DA

[56] References Cited
UNITED STATES PATENTS

| | | | |
|---|---|---|---|
| 3,038,029 | 6/1962 | Carbrey | 340/347 DA |
| 3,184,734 | 5/1965 | Uren | 340/347 DA |
| 3,217,147 | 11/1965 | Chapman | 340/347 DA |
| 3,877,023 | 4/1975 | Spicer | 340/347 DA |

*Primary Examiner*—Charles D. Miller
*Attorney, Agent, or Firm*—Richards, Harris & Medlock

[57] ABSTRACT

Binary input data or analog voltages are processed in parallel paths to form a bi-level (coarse and fine) output. A binary input is parallel processed to produce an analog current output and an analog input is parallel processed to produce a binary coded output. For binary-to-analog conversion, analog multiplexing and scaling adjusts the fine current to the coarse current prior to summing into a composite analog output. An analog input is continuously available to a comparator that senses voltage levels and reference voltages to provide binary coded linear scale pulses for parallel processing into fine increments of a binary output and coarse increments of a binary output combined into a total binary coded output.

29 Claims, 13 Drawing Figures

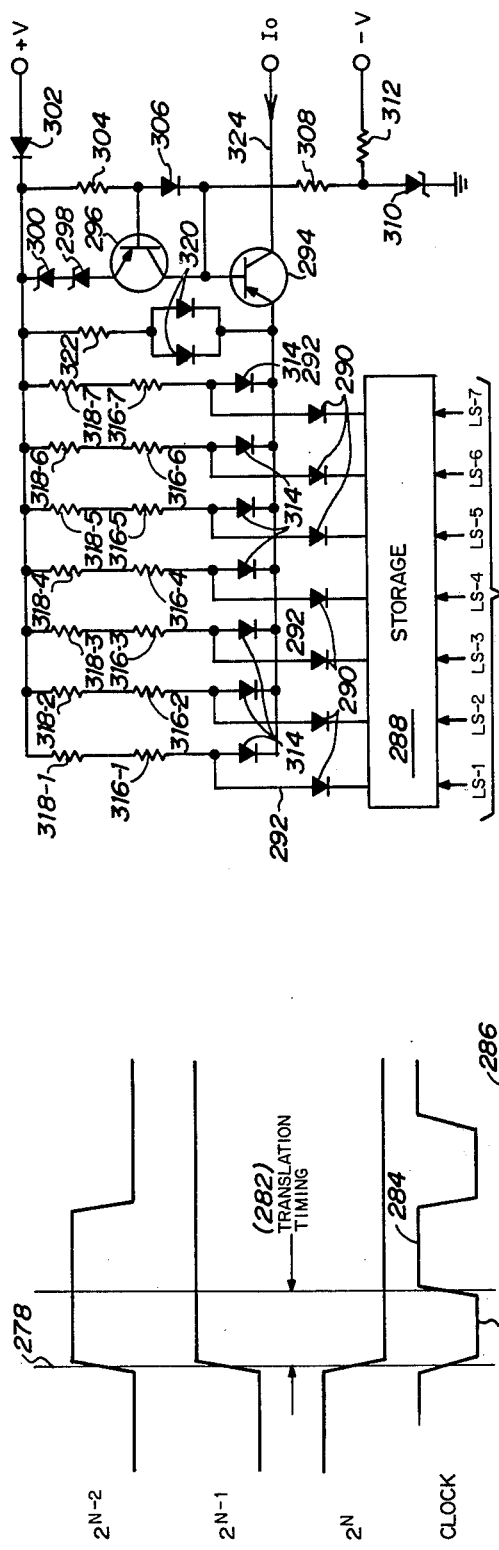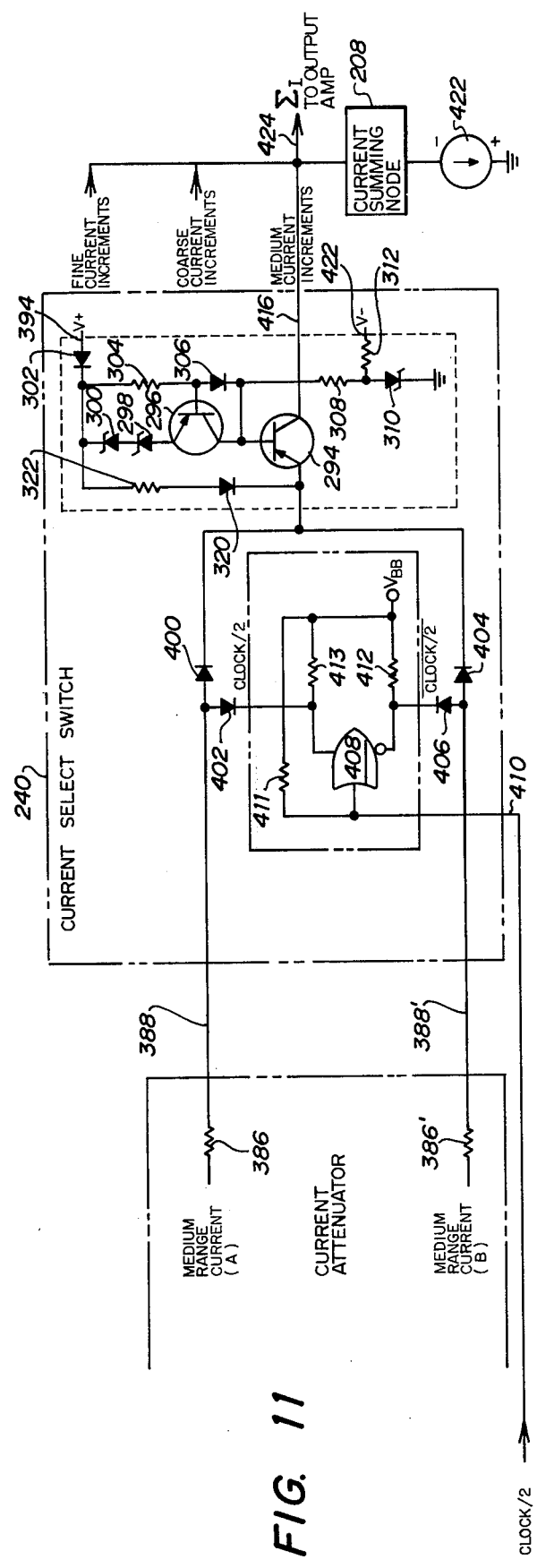
FIG. 9
FIG. 7
FIG. 11

SIGNAL CONVERTER

This invention relates to a signal converter, and more particularly to a converter for providing high resolution and high conversion rates by parallel processing the coarse information bits of a binary input simultaneously with the fine information bits.

Heretofore, analog converters have had limited performance characteristics at conversion rates in excess of 15 megasamples per second. Some prior art converters have even been limited in performance to conversion rates in excess of 5 megasamples per second.

The conventional binary weighted digital-to-analog converter produces a dynamic error at a mid-range signal when all the bits of the input code are changing, thus limiting performance at the higher conversion rates. Primarily, this error is due to the switching of unequal currents (binary weighted) that may have different time constants that produce shifts in the system operating point (nonlinear or even nonmonotonic response). Other prior art digital-to-analog converters utilize the technique of sample and hold to extend the range of conversion up to 15 megasamples per second at the expense of low conversion rate response, due to the poor response (droop) characteristics of the sample and hold circuit at the low conversion rates.

A feature of the present invention is to provide a digital-to-analog converter with a predictable uniform transient response (uniformalized, low dynamic error) over conventional method by using a bi-level (coarse and fine) conversion technique. Coarse current in the analog output is generated by switching equal weighted current sources; hence, uniform transient response. Fine current in the analog output is generated by parallel path weighted current switches, and summed with the coarse current after the transients have settled; hence, uniform transient response. The fine current selected is always less than the coarse current increment, and selected with a current switch identical to the type used to switch the coarse current. A converter in accordance with the present invention having parallel processing paths to form a bi-level (coarse and fine) analog output, gains an advantage in accuracy and conversion rate while achieving low dynamic error (uniform response) when compared to conventional techniques.

Binary input words are accepted by a uniformalized digital-to-analog converter, and upon command, an input word is converted into a corresponding analog output current (or voltage). Each input word is converted by parallel processing by dividing the word such that a "coarse" conversion is made for the higher magnitude bits of the input word and a "fine" conversion is made for the lower magnitude information bits of the input word. For the conversion of the fine increments (lower magnitude bits) of the input word, two independent analog outputs are developed, and each settled current is alternately switched to a summing node to be combined with the converted corresponding higher magnitude input bits. In one embodiment, the fine increments are demultiplexed and then converted into analog currents and the analog output is then multiplexed at the summing node. The fine increment analog output is in a sense an interpolation of the coarse analog, since the summation results in the insertion of the fine increments within the coarse increments. Coarse current in the analog output is generated by switching equal weighted current sources in a linear scale current switch. Prior to summation of the coarse analog current and the fine analog current, the fine currents are passed through current attenuators to scale and match the fine increment current to "fit" the coarse increment current. When parallel processing of the fine increments of the input bits is utilized, a current switch selects the fine current to be summed with the coarse increment current.

To convert an analog voltage into a binary signal, the analog input is applied to a comparator which responds to voltage levels established by a voltage ladder to generate binary coded linear scale pulses in a combination related to the magnitude of the analog input. Outputs of the comparator are applied to a linear scale current switch that provides an analog voltage to a differential amplifier having the original analog voltage as a second input, where the original analog voltage is time delayed in a delay circuit. The difference voltage between the linear scale current switch output and the delayed original analog voltage represents the fine increments of a binary output, and these increments are sampled in a second comparator and applied to a linear scale binary translator that provides a binary bit output. The output of the first comparator is also applied to a coarse linear scale to binary translator that provides the coarse increments of a binary output. The binary output of the second comparator/translator is combined with the stored output of the first binary translator to form the output binary word.

In accordance with the present invention, a uniformalized digital-to-analog converter includes a binary-to-binary translator responsive to the most significant (coarse) bits of a binary input and generates a binary coded linear scale output. This binary coded linear scale output is applied to a first current switch that produces coarse analog current output varying with the binary input. A second current switch responds to the least significant (fine) bits of the binary input and generates fine analog current varying therewith. The analog current of the first switch and of the second switch are summed into a total analog current. When the second current switch is selected and summed with the analog output, the least significant (fine) bits of the next word are applied to a third current switch (identical to the second current switch). By analog multiplexing and scaling the fine analog current to fit (interpolate) the coarse analog current, minimum error is provided. Fine current scaling is performed by current attenuators at the output of the second (and third) current switch. The highest data rates are achieved since only equal weighted coarse increments and settled fine increments are switched into the analog output.

In accordance with another embodiment of the invention, a presettling input demultiplexer enables the conversion process to continue with changing binary input data, but prevents an analog output response until an appropriate clock command. When using the presettling input demultiplexer, a third current switch parallels the second current switch and also responds to the least significant (fine) bits of the binary input to generate an analog current output varying with the input. The demultiplexer provides clock commands to a current select switch having one input from the second current switch and a second input from the third current switch for alternately coupling one of the input currents thereto to be summed with the coarse analog current, only when adjacent input words differ in magnitude. This embodiment provides the fastest overall conversion time with rates in excess of 100 megasamples per second.

Further in accordance with the present invention, the binary input data is processed along three parallel paths with the coarse increments and the fine increments of the binary input processed in single paths and the intermediate current increments processed through parallel conversion paths. Both the coarse increment conversion and the fine increment conversion include a digital translator followed by a current switch responsive to the binary coded linear scale output of the translator and producing a current output varying with an input. In addition, the fine current processing path includes a current attenuator. The intermediate increments of the binary input are converted by parallel current switches responsive to alternate input words and selected for summing the fine analog current with the coarse analog current by a clock commanded current selector. Either method of processing alternate current (as previously described) could be used to process the intermediate bits.

In accordance with another embodiment of the invention, parallel processing of an analog voltage (or current) provides a binary output with coarse increments of the output supplied by a first linear scale to binary translator and fine increments of the output provided by a second linear scale to binary translator. The analog voltage is applied to a linear scale comparator that produces a binary coded linear scale output varying in accordance with an analog input. This binary scale is applied directly to the first linear scale to binary translator for conversion into the coarse increments of the binary output. Likewise, the binary scale is applied to a linear scale current switch that provides an analog current to be compared with a delayed signal of the original analog voltage in a differential amplifier to produce a fine increment analog voltage that is applied to the second linear scale comparator. The output of the linear scale comparator drives the second linear scale to binary translator.

A more complete understanding of the invention and its advantages will be apparent from the specification and claims and from the accompanying drawings illustrative of the invention.

Referring to the drawings:

FIG. 7 is a typical timing diagram of the binary coded linear scale translator of FIG. 6;

FIG. 9 is a schematic of a linear scale current switch as used in the digital-to-analog converters of the present invention;

FIG. 11 is a schematic of a current select switch for use with the converters of the present invention;

Figure 1:
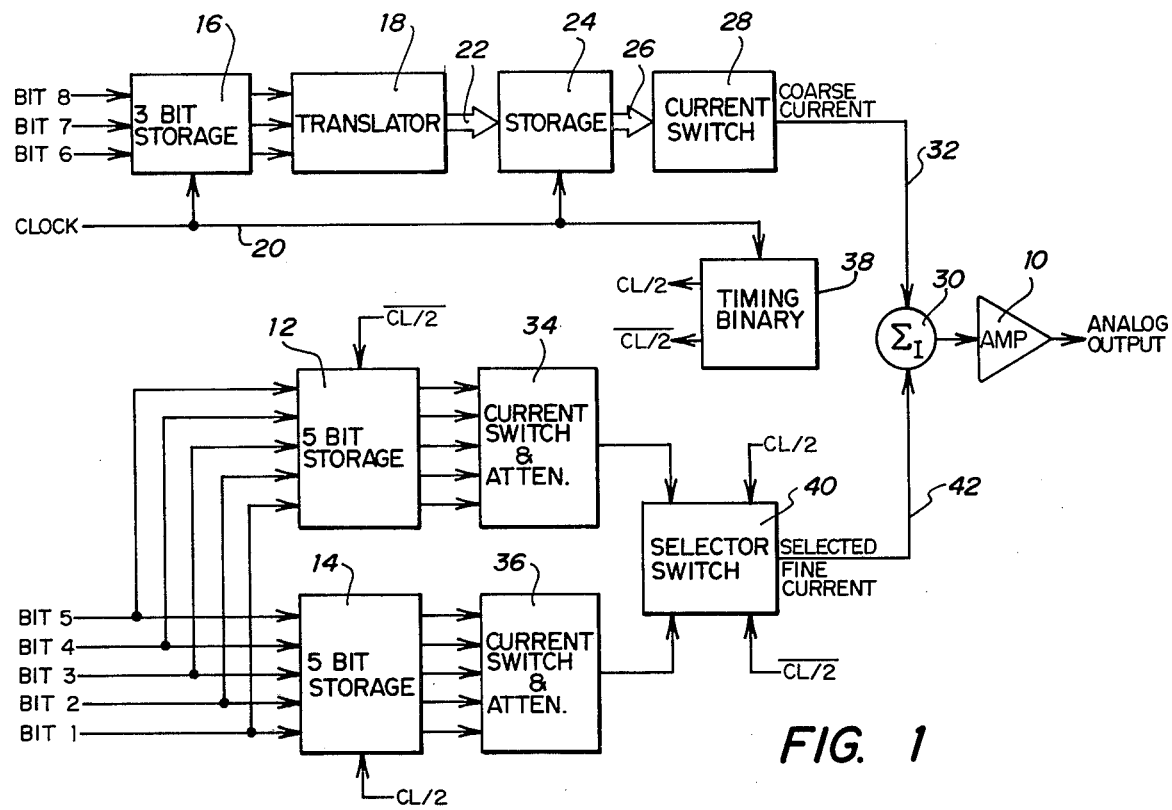
FIG. 1 is a block diagram of an eight bit binary input-to-analog output uniformalized digital-to-analog converter providing parallel processing of coarse increment and fine increment values of the binary output.

Referring to FIG. 1, an eight bit binary output to be converted into an analog voltage at the output of an amplifier 10 is divided into five least significant bits as a fine increment of the input and three most significant bits as coarse increments of the input. The fine increments are coupled in parallel to five bit storage registers 12 and 14 of a conventional design for temporarily storing the input information bits. Similarly, the coarse increments of the input are applied to a three bit storage register 16 of a conventional design for providing temporary storage.

Considering first the coarse increment conversion, the three information bits in the register 16 are clocked into a binary-to-binary coded linear scale translator 18 at the full conversion rate as established by clock pulses on a line 20. The translator 18 converts the binary input from the storage 16 into a binary coded linear scale (BCLS) output on a channel 22. The BCLS output of the translator 18 is in a form suitable to drive the "coarse" current generator.

The BCLS output on the channel 22 is applied to a storage register 24 that provides the necessary time delay to synchronize the conversion of the coarse increments with the conversion of the corresponding fine increments of the binary input. Information in the storage register 24 is clocked at the full conversion rate onto a channel 26 and applied to a linear scale current switch 28. The linear scale current switch (LSCS) 28 converts the BCLS input into a corresponding analog current output. This analog current output is applied to a summing node 30 over a line 32.

The fine increments of the binary input in the storage registers 12 and 14 are alternately clocked into binary weighted current switches (BWCS) 34 and 36, respectively, by means of clock pulses at half the conversion rate applied to the storage registers. These clock pulses (CL/2 and $\overline{CL/2}$) are generated by timing binary logic 38 from the full clock conversion rate pulses on the line 20. Each of the binary weighted current switches (BWCS) 34 and 36 converts the binary input thereto into a corresponding analog current output.

Also included with the binary weighted current switches 34 and 36 are current attenuators that perform the function of scaling the analog current. Both gain and offset are variables and the current attenuators function to correct the output of the current switches to correspond with the coarse current from the current switch 28.

Corrected analog currents from the current switches 34 and 36 are applied to individual inputs of a current select switch 40 that is clocked at half the conversion rate by clock pulses from the timing binary logic 38. The current select switch performs the function of an analog current multiplexer to properly select the fine increment analog current to be summed with the coarse analog current on the line 32. The selected fine current at the output of the select switch 40 is applied to the summing node 30 over a line 42.

In operation of the eight bit uniformalized digital-to-analog converter of FIG. 1, alternate samples of the five least significant bits of the binary input are processed independently through one or the other of the channels including the current switches 34 or 36. The current select switch 40 is driven out of phase with respect to the five bit storage registers 12 and 14 thereby allowing one clock cycle of settling time before the fine analog current is applied to the summing node 30 and amplified through the amplifier 10.

In the coarse conversion channel, the three bit de-skewing storage register 16 is provided since the fine current selected by the switch 40 is delayed by one clock cycle. Signals at the output of the translator 18 are stored synchronously in the register 24 with the operation of the current select switch 40 so that the selected coarse current and fine current enter the summing node 30 at the same time. Thus, the most significant bits of a binary input are processed to the summing node 30 simultaneously with the least significant bits of the input through the channel containing the current switch 34 or 36. The subsequent binary input is similarly processed through the coarse parallel channel but is passed through the fine current channel in the alternate path through the current switch 34 or 36 as the previous binary input.

Thus, with the system of FIG. 1, alternate fine increments of a binary input are processed by two independent channels operating at ½ the conversion rate, and their output alternately selected (multiplexed) to be summed as a part of the analog output. The demultiplexing of the digital input and the multiplexing at the analog output has regular alternate timing to achieve the highest conversion rate as limited by the input logic elements. The demultiplexing provides one clock cycle settling time for the conversion process (one of the current switches 34 or 36 is settling while the other is providing the analog output). The analog multiplexing thus provides a uniform response and reduces dynamic error.

Figure 2:
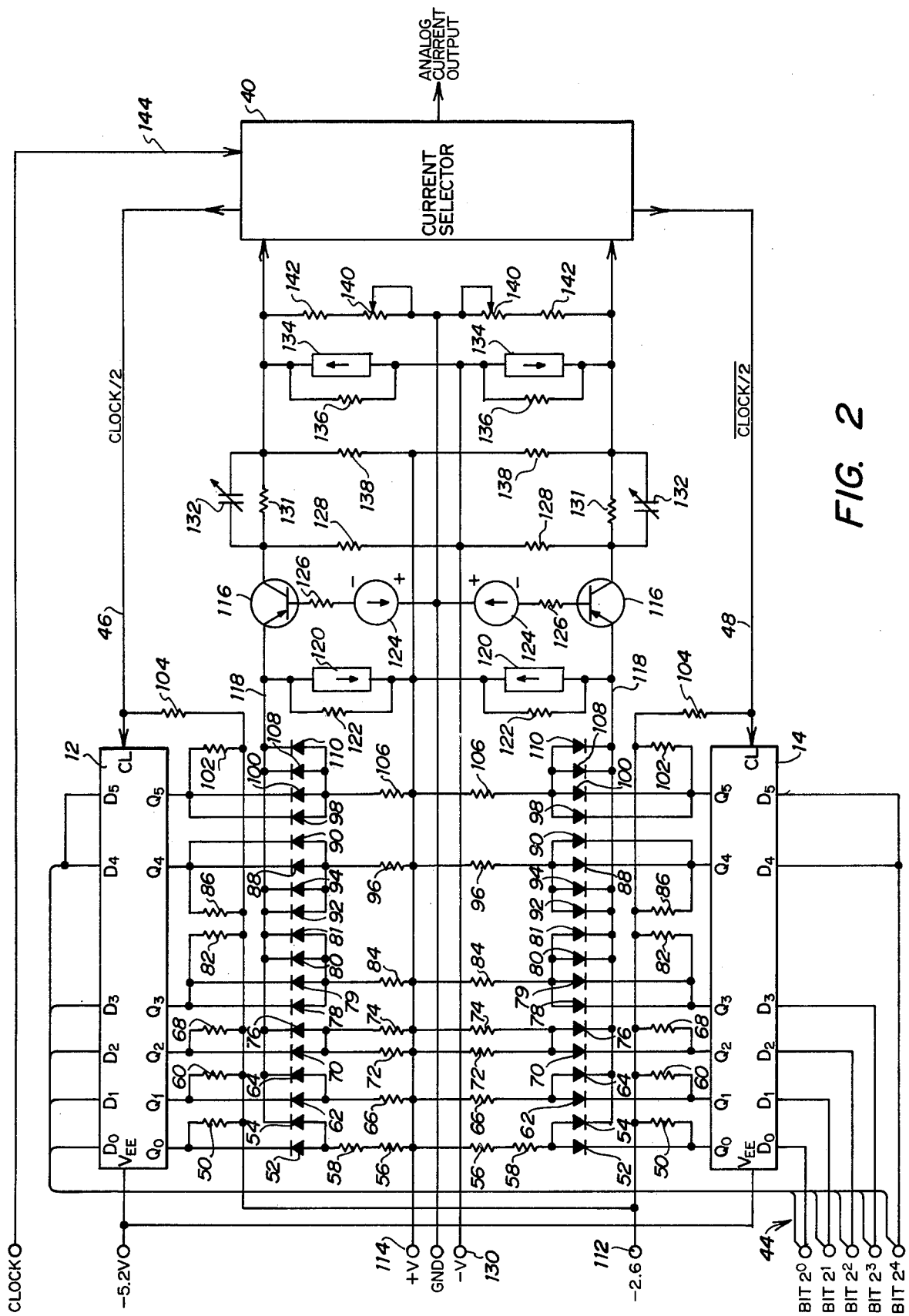
FIG. 2 is a schematic of the dual channel fine increment processor of the eight bit digital-to-analog convertor of FIG. 1.

Referring to FIG. 2, there is shown a schematic of the fine conversion channels of the digital-to-analog converter of FIG. 1. The least significant input bits on the terminals 44 are simultaneously applied to storage registers 12 and 14 which may comprise master-slave flip-flops or equivalents interconnected as a conventional storage register. The flip-flops of the register 12 are clocked at half the conversion rate by a clock/2 pulse on a line 46, while the flip-flops of the storage registers 14 are clocked at half the conversion rate by a clock/2 pulse on a line 48.

Connected to the $Q_0$ terminal of the registers 12 and 14 is a bias resistor 50 and the cathode electrode of a diode 52. The diode 52 is interconnected to a diode 54 and to series resistors 56 and 58. The $Q_1$ terminal of the storage registers 12 and 14 is similarly connected to a bias resistor 60 and a diode 62 having an interconnection to a diode 64 and a resistor 66. Connected to the $Q_2$ terminal is a bias resistor 68 and a diode 70. The diode 70 is interconnected to parallel resistors 72 and 74 and a diode 76. The conversion circuit for the fourth bit, as applied to the terminal $Q_3$, includes diodes 78–81 with the diodes 78 and 79 interconnected to a bias resistor 82. The common interconnection of the diodes 78–81 is to a resistor 84. Connected to the terminal $Q_4$ of the registers 12 and 14 is a resistor 86 and diodes 88 and 90. These two diodes have a common anode connection to diodes 92 and 94 and also to a resistor 96. The last output terminal (terminal $Q_5$) of the registers 12 and 14 connects to diodes 98 and 100 and to bias resistors 102 and 104. The diodes 98 and 100 are interconnected to a resistor 106 and to diodes 108 and 110.

Each of the resistors 50, 60, 68, 82, 86, 102 and 104 is interconnected to a negative bias voltage at a terminal 112. Also, each of the resistors 56, 66, 72, 74, 84 96 and 106 is interconnected to a positive voltage supply at a terminal 114. These resistors, along with resistor 58, provide a current ladder at the interconnection of the diode array. To produce this current ladder, the resistance in each path to the terminals of the storage register is equal to one-half the resistance value in the preceding path. That is, the resistors 56 and 58 provide twice the resistance to the diodes 52 and 54 as the resistor 66 to the diodes 62 and 64.

Each of the diodes 54, 64, 76, 80, 81, 88, 90, 108 and 110 is interconnected to the emitter electrode of common base amplifier transistor 116 by means of a line 118. Also connected to the line 118 is a constant current source 120 having an output resistance 122. A base bias circuit for the transistor 116 includes a constant voltage source 124 having a positive terminal connected to ground and a negative terminal in series with its output resistance 126. The collector electrode of the transistor 116 is supplied a negative voltage through a resistor 128 connected to a terminal 130. An emitter current developed by the diode array provides a collector current for a transistor 116 that is coupled to the current select switch 40 through a resistor 131 in parallel with a variable capacitor 132. This resistor capacitor circuit forms part of the current attenuator that also includes a constant current source 134 shunted by its output resistance 136. A positive drive voltage is supplied to the current attenuator through a resistor 138. A further adjustment of the fine current to correspond with the coarse current before coupling to the summing node 30 is provided by a variable resistor 140 in series with a resistor 142.

Note, that the binary weighted current switch (BWCS) of FIG. 2 comprises two identical circuits connected bact-to-back, and for purposes of this description corresponding components are identified with the same reference number. Operation of each of these current switches is identical, one connected to receive information bits from the binary input as stored in the register 12 and the other information bits stored in the register 14. The information bits of the binary input to be coupled to the current select switch are under the control of the clock/2 and $\overline{\text{clock/2}}$ pulses on the lines 46 and 48, respectively, as generated by the current select switch 40.

In the embodiment shown in FIG. 2, the current select switch 40 receives clock pulses at the full conversion rate on a line 144. These clock pulses are applied to a flipflop converter in the current select switch 40 which generates the clock/2 pulse on the line 46 and the clock/2 pulse on the line 48 for alternate operation of the storage registers 12 and 14, respectively.

Figure 3:
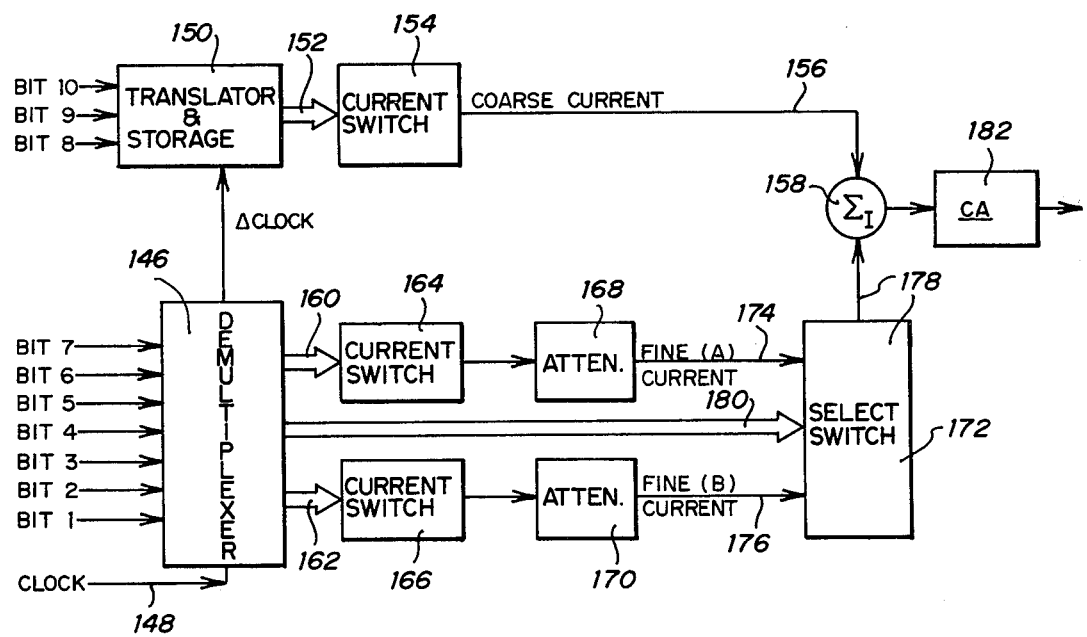
FIG. 3 is a block diagram of a ten bit uniformalized digital-to-analog converter employing parallel processing of coarse and fine increment bits of a binary input with a presettling input demultiplexer alternately providing input data to one of two channels for fine increment processing.

Referring to FIG. 3, there is shown a block diagram of a 10 bit uniformalized digital-to-analog converter using parallel processing and a presettling input demultiplexer 146. A digital-to-analog converter of FIG. 3 provides a minimum delay time (through put or true converter time), since the demultiplexer 146 utilizes lood ahead logic where no storage is required at the input for any of the fine increment information bits of the binary information.

Information bits 1–7 are applied to the demultiplexer 146 that is clocked at the full conversion rate by clock pulses on a line 148. Clocking of the demultiplexer 146 is cycled to provide a conversion event at time intervals to insure that the most significant bits applied to a binary code linear scale translator 150 have settled. The advantage of the embodiment of FIG. 3, over that shown in FIG. 1, is that the conversion of a binary input is completed in one clock cycle where, by comparison, the system of FIG. 1 requires two cycles of the clock to provide a single output.

By use of look ahead logic, the demultiplexer 146 permits the conversion process to start when the input data bits change. Further, such logic provides for timing of the analog multiplexing and storage of a binary input word which corresponds to the output current synchronous with the conversion clock rate. Look ahead logic is used since at least two identical fine increment conversion channels (A) and (B) are utilized, one such channel synchronous with the conversion clock (or its derivative) and the other channel asynchronous with the binary input word. The demultiplexer 146 is inhibited from completing a conversion cycle if consecutive words have the same numerical value, indicating that no change in the analog output is required.

Coarse increment information bits applied to the translator 150 are converted into a binary coded linear scale (BCLS) output on a channel 152 and applied to a linear scale current switch (LSCS) 154 wherein the BCLS input is converted into a corresponding analog current output on a line 156. This channel of the embodiment of FIG. 3 is similar to the coarse increment conversion channel of FIG. 1. The coarse analog current on the line 156 is applied to a summing node 158.

Fine increments of the binary input are stored in the demultiplexer 146 and alternately switched onto either channel 160 or 162. Channel 160 couples to the input of a binary weighted current switch (BWCS) 164 and the channel 162 connects to the input of a binary weighted current switch (BWCS) 166.

In the embodiment of FIG. 3, current attenuators 168 and 170 are coupled to the output of the current switches 164 and 166, respectively. A binary input to the switch 164 is converted into a fine analog current that is adjusted for magnitude in the current attenuator 168 and applied to a current select switch 172 over a line 174. Similarly, a binary input to the current switch 166 is converted into a fine analog current that is adjusted for magnitude in the current attentuator 170 and applied to the current select switch 172 over a line 176. The current select switch 172 transmits either the current on the line 174 or the current on the line 176 to the summing node 158 over a line 178. The selected current is determined by a clock/2 pulse or a clock/2 pulse as generated on a line 180 from the demultiplexer 146.

A selected fine analog current on the line 178 and the coarse analog current on the line 156 are combined in the summing node 158 to provide an analog current to the input of a current attenuator 182 that varies in accordance with the binary input. The output current attenuator 182 is used for scaling (gain and offset) to the final desired analog output level.

Figures 4, 8:
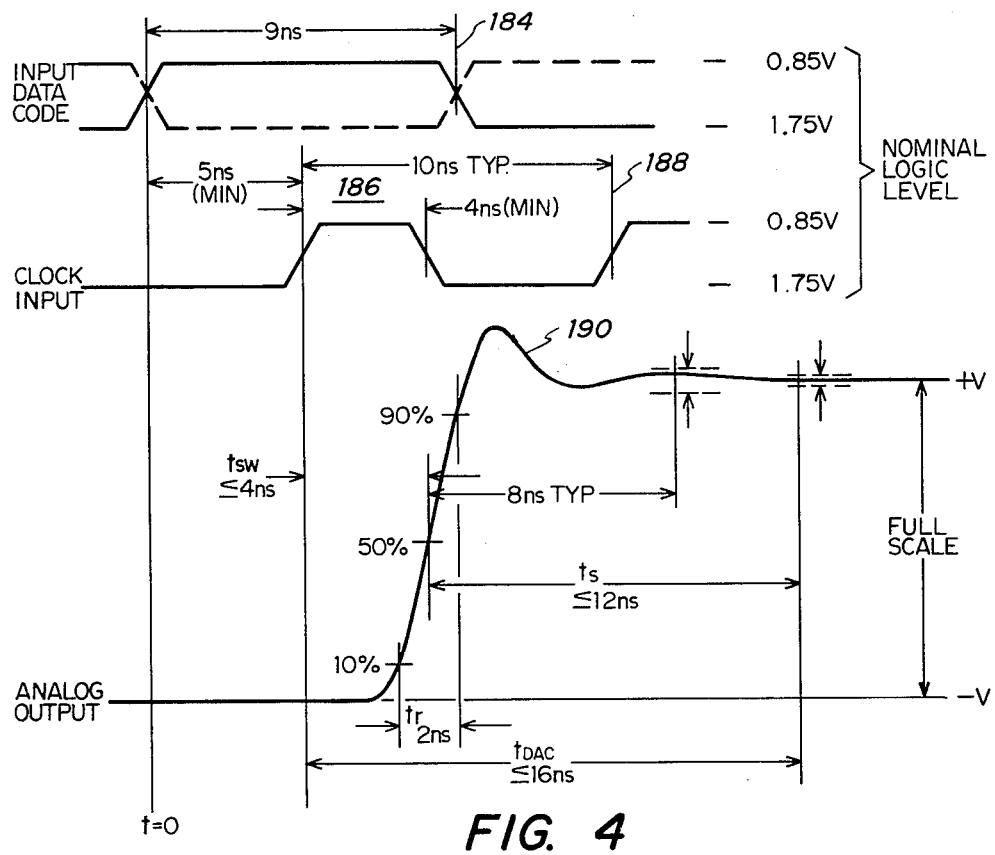
FIG. 4 is a timing diagram for the ten bit uniformalized digital-to-analog converter of FIG. 3.
FIG. 8 is a truth table for the binary-to-binary coded linear scale translator of FIG. 6.

Referring to FIG. 4, there is shown a typical timing diagram for the ten bit uniformalized digital-to-analog converter of FIG. 3. Starting at time zero ($t=0$), binary input data appears at the input of the demultiplexer 146 and the translator 150 for a minimum of nine nanoseconds, as indicated by the time line 184. Approximately five nanoseconds after time zero, a time sufficient to allow settling of the input data into the demultiplexer 146 and conversion in the translator 150, an input clock pulse is generated on the line 148. This clock pulse has a minimum of four nanoseconds as indicated by the time spacing 186. Clock pulses occur on line 148 at the conversion rate (up to 111 MHz as shown in intervals of nine nanoseconds).

With reference to FIG. 4, the next clock pulse will appear at the time cycle 188. A time $t_{sw}$ approximately five nanoseconds from time zero, current from one of the current switches 164 or 166 is coupled through the current select switch 172 to the summing node 158. Simultaneously, the most significant increments are clocked from the translator 150 through the current switch 154 and also applied to the summing node 158. An analog current (or equivalent analog voltage) appears at the output of the current attenuator 182, as shown by the curve 190 of FIG. 4. The elapsed time ($t_{DAC}$) from the clocking of the switch 172 and the translator 150 to the full scale value of the analog output signal is equal to or less than 16 nanoseconds.

With reference to FIG. 4, the values given are typical and would vary with the implementation of the converter of FIG. 3. FIG. 4, however, does illustrate the sequence of operation of the converter of FIG. 3 from the input of binary data to the demultiplexer 146 and the translator 150 to a full scale analog current (or voltage) at the output of the current attenuator 182.

Figure 5:
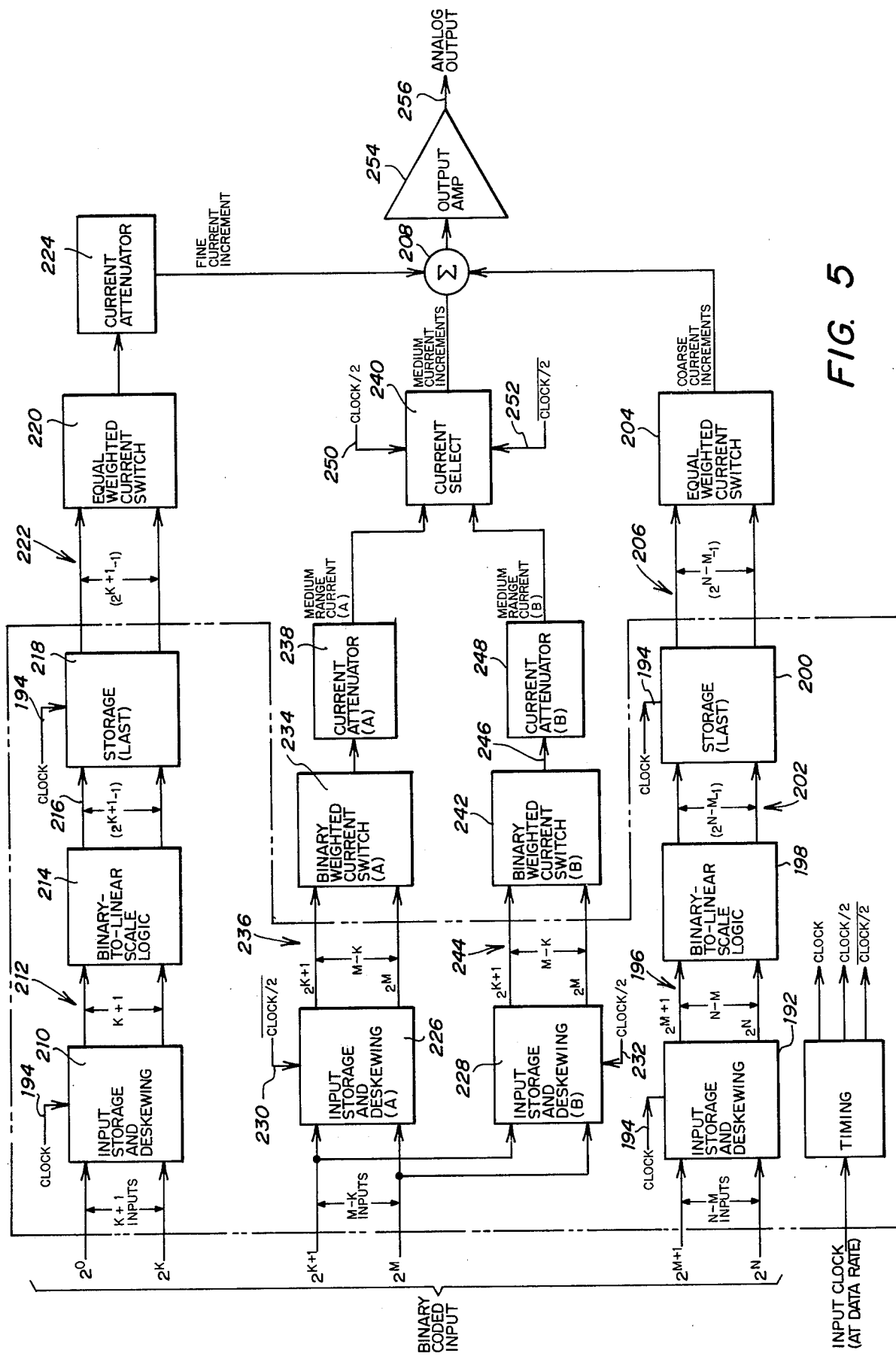
FIG. 5 is a block diagram of a three channel digital-to-analog converter for simultaneously processing coarse increments of a binary input along with fine increments of the input and intermediate increments.

Referring to FIG. 5, there is shown a block diagram of a three channel uniformalized digital-to-analog converter to emphasize that the invention is not limited to two channel conversion, but rather to parallel conversion using two or more channels. The most significant increments of a binary coded input ($n-m$ terms) are applied to a storage and deskewing register 192 that is clocked at the full conversion rate by clock pulses on a line 194. The input bits are applied, in response to a clock pulse, over channels 196 to a binary-to-linear scale translator 198 having an output applied to a storage register 200 by means of channels 202. Data stored in the register 200 is clocked at the full conversion rate into an equal weighted current switch 204 over channels 206.

Basically, the coarse current conversion channel of the system of FIG. 5 is similar to that of FIGS. 1 and 3. An output from the equal weighted current switch is an analog current corresponding to the binary coded linear scale (BCLS) output of the translator 198. This analog coarse current is applied to a summing node 208.

The least significant or fine increments of a binary coded input ($k+1$ terms) are converted in a channel similar to the conversion channel for the coarse increments. Input bits are applied to a storage and deskewing register 210 that is clocked at the full conversion rate by clock pulses on the line 194. At the next clock pulse after storing data into the register 210, it is transferred over channels 212 into a binary-to-linear scale translator 214. The linear scale (BCLS) output of the translator 214 is transmitted over channels 216 to a storage register 218 clocked at the full conversion rate by clock pulses on the line 194.

At a time synchronous with the operation of the storage register 200, the linear scale output of the translator 214 is transmitted to an equal weighted current switch 220 over channels 222. A fine analog current output of the switch 220 is applied to the input of a current attenuator 224 for scaling the magnitude of the fine analog current to correspond with the magnitude of the coarse current. The adjusted output of the attenuator 224 is applied to the current summing node 208 in synchronism with the coarse analog current from the current switch 204.

Increments of the binary coded input (m–k terms) not applied to the storage registers 192 and 210 are applied to storage and deskewing registers 226 and 228 connected in parallel to form two parallel current paths for the intermediate increments of the binary coded input. These registers are alternately clocked at half the full conversion rate by a clock/2 pulse on a line 230 to the register 226, and a clock/2 pulse on a line 232 to the register 228.

Considering first channel A for the intermediate increments of the binary coded input, at the clock time that data is stored in the register 226 it is also transferred to a binary weighted current switch 234 over channels 236. The converted output of the current switch 234, in the form of an analog current, is applied to a current attenuator 238 to scale the amplitude to correspond with the amplitude of the current from the current switches 204 and 220. This scaled current is applied to a current select switch 240 having a second input connected to channel B for the intermediate bit conversion.

Channel B includes a binary weighted current switch 242 for converting the binary data transferred from the register 228 over channels 244 into an analog current on a line 246 connected to the input of a current attenuator 248. An output from the current attenuator 248 is applied to the second input of the current select switch 240.

The current select switch 240 is clocked at half the conversion rate by a clock/2 pulse on a line 250 and a clock/2 pulse on a line 252. Alternately, the current select switch 240 connects the output of the current attenuators 238 and 248 to the current summing node 208, simultaneously with the outputs of the current switches 204 and 220.

Connected to the current summing node 208 is an output amplifier 254 that provides an analog output on a line 256 equal to the sum of the currents to the summing node 208 and corresponding with the value of the binary coded input.

Figure 6:
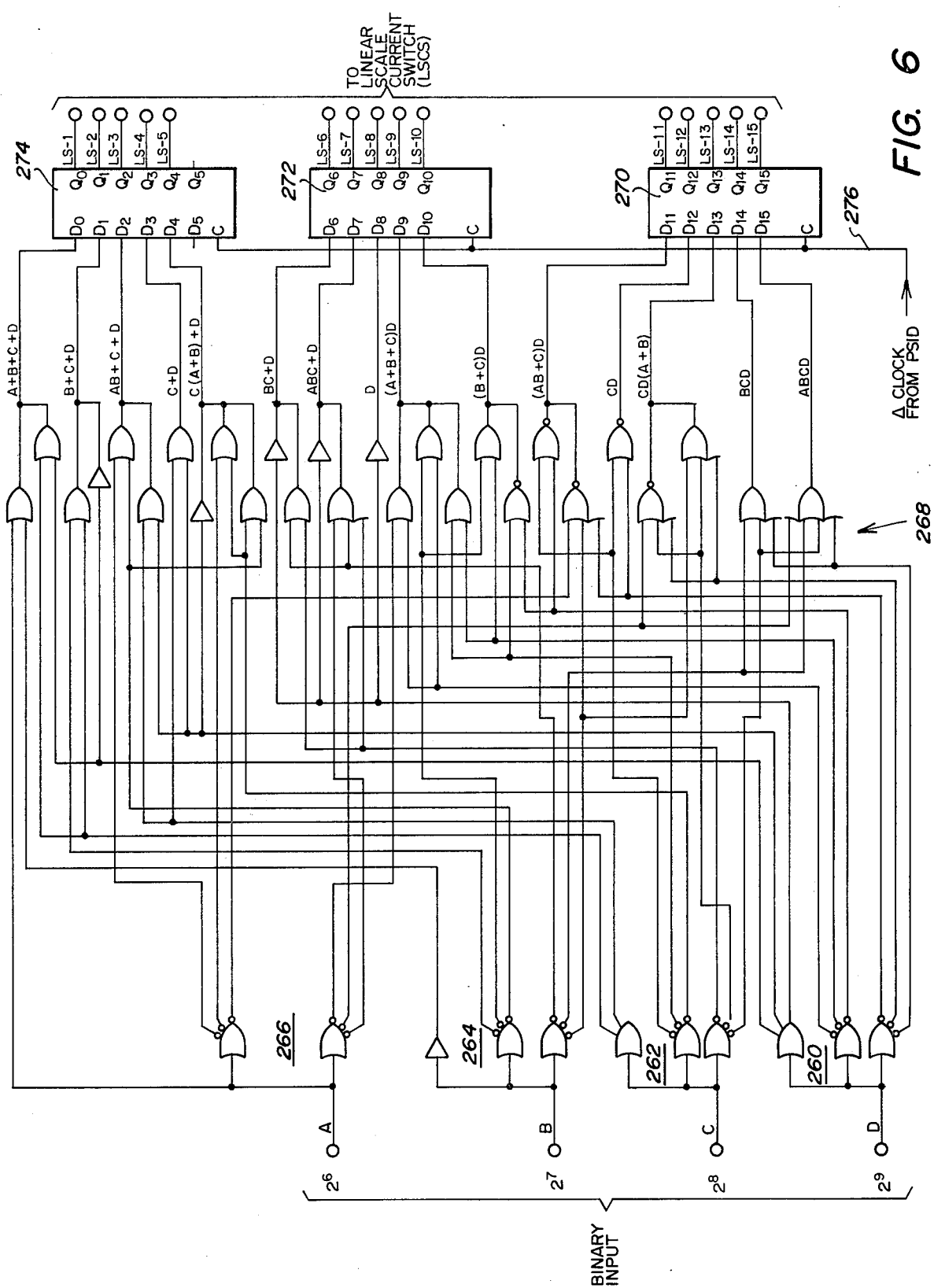
FIG. 6 is a logic diagram for a binary-to-binary coded linear scale translator for the system of the present invention.

Referring to FIG. 6, there is shown a logic diagram of the binary-to-linear scale translators of the system of FIGS. 1, 3 and 5. It should be noted, that the logic of FIG. 6 is only one implementation for the binary-to-binary coded linear scale translators.

Four bits of a binary coded input are individually applied to OR/NOR gates 260, 262, 264 and 266. The multiple outputs of each element of this OR/NOR gate logic is applied to inputs of an OR/NOR gate array 268. The various Boolean algebraic functions performed by the OR/NOR gates in the array 268 are shown in FIG. 6 on the output lines from the logic elements.

Following the OR/NOR gate array 268 are storage registers 270, 272 and 274. The final output of the translator includes the storage registers to prevent applying erroneous combinations from the output to the linear scale current switch during the translation of the binary inputs. These storage registers are clocked by clock pulses on a line 276. The translation logic will have settled by the time a clock pulse appears on the line 276.

Referring to FIG. 7, there is shown a typical relative timing diagram for the translator of FIG. 6. The data transitions for the individual input bits occur at the timing marks 278. The clock pulse 280 at this time is low and the translation is completed within the translation time 282. During the clock pulse 284, the translated data in the registers 270, 272 and 274 appears at the output of these registers as given by the curve 286. This linear scale output, as shown by the curve 286, is transmitted to linear scale current switch.

Referring to FIG. 8, there is shown the truth table required for the translation of two bit, three bit and four bit binary input codes in a translator of the type shown in FIG. 6. Linear scale output (LS-1) is a logic ONE for every state of the binary input code except the zero state. Each successive LS output is a logic ONE for every state except two states (State 0 and State 1), except three states, etc., except $n$ states of the input binary code. The LS outputs may be considered as fractions of the whole with the whole being the linear scale applied to downstream components of a conversion channel.

Referring to FIG. 9, there is schematically shown a linear scale current switch for the systems of FIGS. 1, 3 and 5 that provides the resolution required for a multiple bit digital-to-analog converter. The binary coded linear scale (BCLS) output from a translator is transmitted into a storage register 288, as in the converters as previously described. Each bit stored in the register 288 is transmitted through a diode 290 over a line 292 to individual paths of the current switch. As illustrated in FIG. 9, the storage register 288 has seven outputs (typical for conversion of three significant inputs) requiring seven parallel diodes 290 connected to individual paths of the current switch.

The current switches are comprised of seven (7) Schottky barrier diodes 290 and seven (7) Schottky barrier diodes 314 which operate as previously described in FIG. 2. The cathode electrodes of diodes 314 are common to the input of a linear common base amplifier, transistor 294. The voltage applied to resistor 316 (1–7) and resistors 318 (1–7) or 322 is controlled by a compound connection of Zener diode 300, Zener diode 298, transistor 296, and Schottky barrier diode 306. When the voltage (base-to-emitter) of transistors 294 and 296 are equal, and the voltage across diodes 314 and 306 are equal, then the voltage applied to each emitter branch resistor 316 and 318, or 322 is equal to the Zener voltage of diode 300 and 298 (where diode 298 and 300 have an internal Zener impedance). The current in each branch, emitter of 294, varies in accordance with the temperature stabilized voltage reference of Zener diode 300 and 298, the mismatch of voltage base-to-emitter of transistors 294 and 296, the mismatch of forward voltage drop of Schottky barrier diodes 314, 320 and 306, and the resistance of 316 and 318, or 322.

The amplifier is highly stable over a broad range of ambient temperature. Within the degree of matched characteristics, changes in voltage base-to-emitter to transistors 294 and 296 and changes in forward voltage drop of diodes 314, 320 and 306 have cancelling effects on error current in transistor 294. Typically, the transistors 294 and 296 may be contained in a common package and matched for operating characteristics. The diodes are matched for forward current characteristics and the current through diode 306 is set equal to the current switched in diodes 314 as well as the bias current through diode 320.

The Zener diode 300 is connected to the positive terminal of the supply through diode 302. Diode 302 is provided for protection against incorrect power supply connections. Base current from transistor 296 and the current limited by resistor 304 flows through diode 306. The current through diode 306, collector current from transistors 296, and base current from transistor 294 flows through resistor 308 to the negative voltage reference established by Zener diode 310. Resistor 312 limits the current from the negative power supply to diode 310 and the base bias circuit. Zener diode 310 provides a stable negative voltage reference, permits the use of a low value of resistor 308 to improve the stability of output current of amplifier 294, and protects against incorrect power supply connection (reversal of polarities).

Currents switched in the emitter branches of transistor 294 are fixed to the binary inputs coupled to the diodes 290 to individual diode switches. Each switching path comprises a diode 314 in series with resistor 316. One or more of the switching paths may include a trimming resistor 318 to compensate for nonlinear base-to-emitter voltage as a function of collector current, and for changes in beta as a function of collector current in transistor 294. Proper compensation for these irregularities by trimming resistor 318 results in accurate current increments at each output collector current operating point. One or parallel diodes 320 in series with resistor 322 establishes the reference (all zero input code) collector current for amplifier 294. The accuracy of the LSCS must exceed the accuracy required by the overall converter as determined by the number of bits in the binary input.

Components values and part numbers for one embodiment of the linear scale current switch of FIG. 9 are given in Table I, where +V = +15 volts and −V = −15 volts.

TABLE I

| REF. NO. | DESCRIPTION | PART NUMBER & MFG. |
|---|---|---|
| 290, 314, 320, 306 | Schottky Barrier Diode | HP5082-2835 Hewlett-Packard |
| 294, 296 | Dual, PNP Transistor | 2N4016, Motorola, Fairchild, National Semiconductor |
| 298 | Zener Diode | MZ620, Motorola |
| 300 | Zener Diode | 1N939, Motorola |
| 310 | Zener Diode | 1N3157, Motorola |
| 302 | Schottky Barrier Diode | HP5082-2800 Hewlett-Packard |
| 304 | Resistor | AR40-T18-16900±0.01% TRW, IRC Resistors |
| 308 | Resistor | AR40-T18-750±0.01% |
| 312 | Resistor | AR40-T18-357±0.01% |
| 322 | Resistor | AR40-T18-5700±0.01% |
| 316(1–7) | Resistors All are TRW, IRC Resistors | AR40-T18-15000±0.01% |
| 318-1 | Resistor | AR40-T18-78.7±0.1% |
| 318-2 | Resistor | AR40-T18-69.8±0.1% |
| 318-3 | Resistor | AR40-T18-64.9±0.1% |
| 318-4 | Resistor | AR40-T18-60.4±0.1% |
| 318-5 | Resistor | AR40-T18-58.3±0.1% |
| 318-6 | Resistor | AR40-T18-55.6±0.1% |
| 318-7 | Resistor All are TRW, IRC Resistors | AR40-T18-54.2±0.1% |

Figure 10:
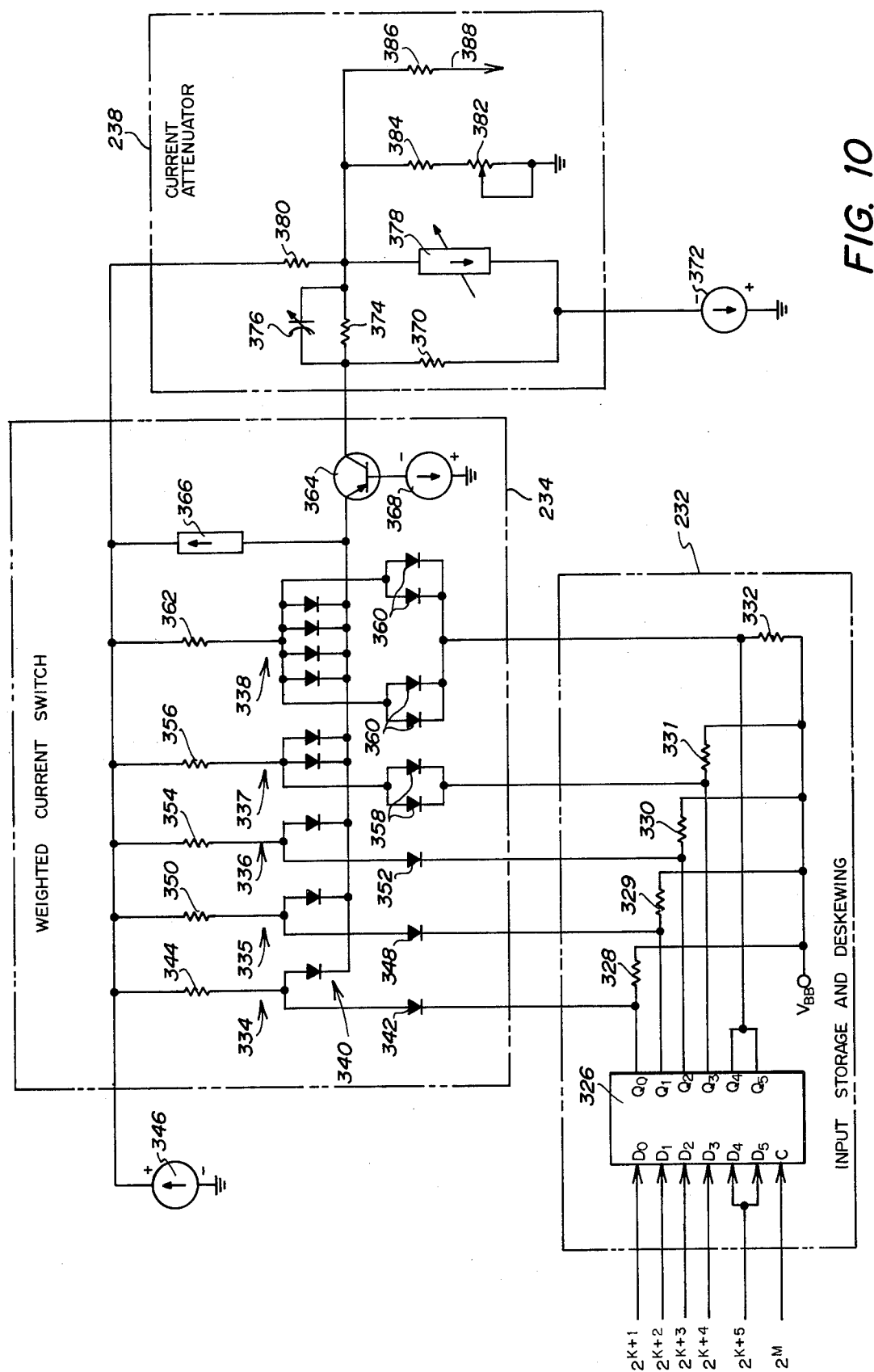
FIG. 10 is a schematic of a binary weighted current switch as used in the converters of the present invention connected to an input storage and deskewing circuit (shown schematically) and a current attenuator, also schematically illustrated.
Figure 13:
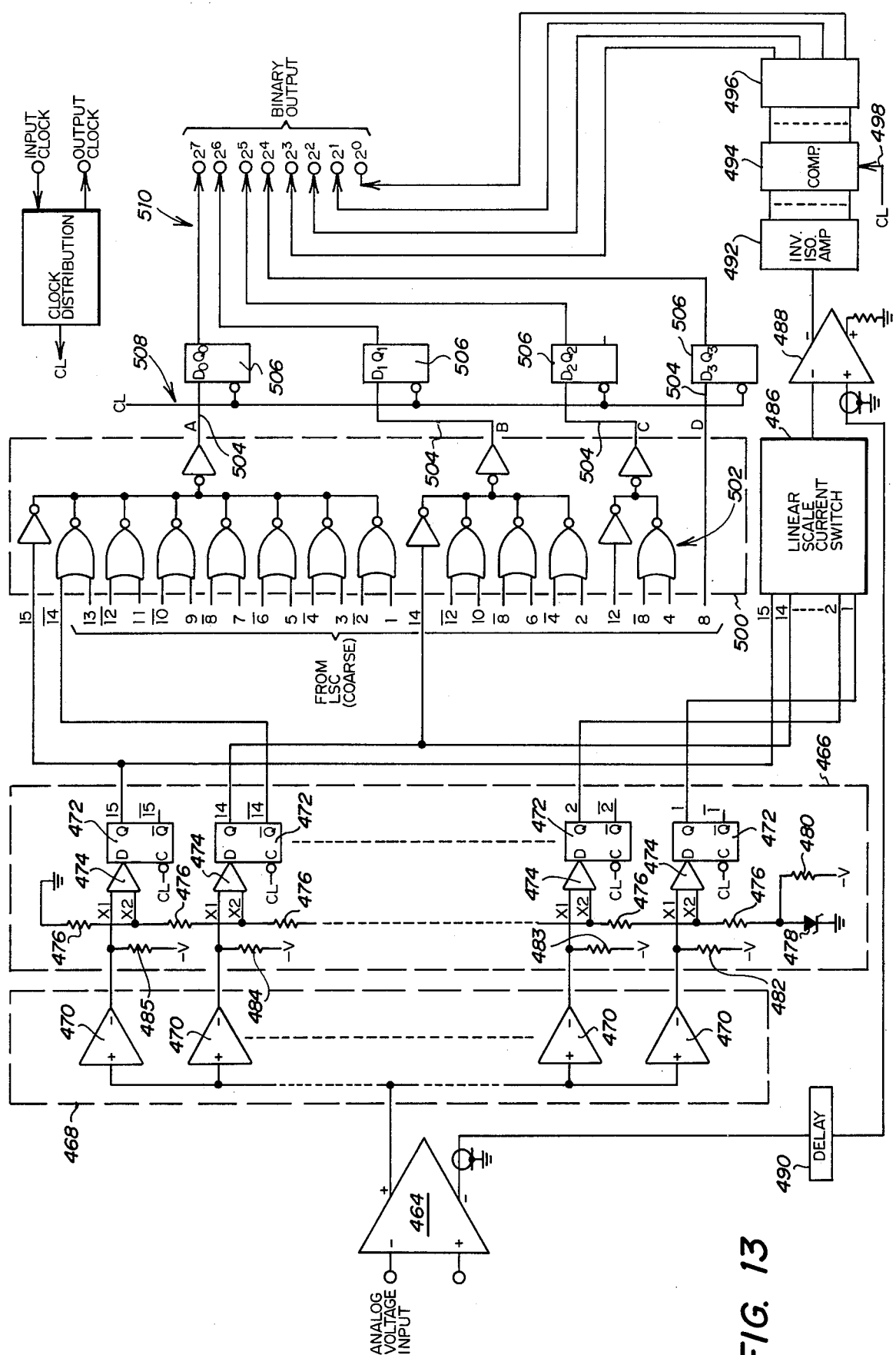
FIG. 13 is a diagram of an analog-to-digital converter utilizing parallel processing to provide fine increments of a binary output through one channel and coarse increments of the binary output through a parallel channel.

The element configuration of the linear common-base amplifier (294, 296, 298, 300, 302, 304, 306, 308, 310, 312, 320, 322, the emitter input and collector output) may be used in: the binary weighted current switch of FIG. 2; circuit blocks 220, 240 and 204 of FIG. 5; the weighted current switch of FIG. 10; the current select switch shown in FIG. 11; as well as all linear scale current switch applications such as in FIG. 1, FIG. 3 and FIG. 13.

An output current on the line 324 through the collector electrode of the transistor 294 is a function of the binary input code that fixes the number of diodes 314 in a forward biased state to determine the emitter electrode current.

Referring to FIG. 10, there is shown intermediate increment channel A of FIG. 5, including the input storage and deskewing resistor 232, coupled to the weighted current switch 234 having an output applied to the current attenuator 238. A similar circuit arrangement is provided for channel B for the intermediate input bit conversion. The binary coded input is applied to an emitter coupled logic register 326. Output terminals of the register 326 are connected to a supply voltage through resistors 328–332 to establish five independent switching voltages.

The weighted current switch 234 is similar to the current switch of FIG. 2, and includes parallel current paths 334 –338 each having one or more diodes 340. The current path 334 includes a diode 342 connected to the resistor 328 and a current limiting resistor 344 tied to a temperature compensated voltage supply 346. In parallel with the path 334 is the current path 335 including a diode 348 connected to the resistor 329 and a resistor 350 tied to the voltage source 346. The parallel path 336 includes a diode 352 connected to the resistor 330 and a resistor 354 interconnected to the voltage source 346. A resistor 356 in the current path 337 also connects to the voltage source 346 and to diodes 358. The diodes 358 are interconnected in parallel to the resistor 331. The current path 338 includes diodes 360 interconnected in parallel to the resistor 332 and to a resistor 362 connected to the voltage source 346. Typically, the diodes 340 and the diodes 342, 348, 352, 358 and 360 are Schottky diodes. The resistance in each of the parallel current paths 334-338 increase by a factor of two from the value of the resistor 362; and, equal currents flow through diodes 340.

A common base amplifier comprising a transistor 364 has an emitter electrode interconnected to the diodes 340 and also to a temperature compensated current source 366. The base drive for the transistor 364 is generated by a temperature compensated voltage supply 368.

A current established in the emitter electrode circuit of the transistor 364 by forward biasing of one or more of the diodes 340 controls the collector electrode current of the transistor 364 as applied to the current attenuator 238. This current attenuator is typical and illustrates one circuit arrangement that may be used in each of the systems of FIGS. 1, 3 and 5.

The collector current of the transistor 364 develops a collector voltage across a resistor 370 connected to a temperature compensated voltage source 372. This voltage is applied to a circuit including a resistor 374 in parallel with a variable capacitor 376. Also connected to the temperature compensated voltage source 372 is a variable temperature compensated current source 378 having a terminal tied to the resistor 374.

A drive voltage for the attenuator 238 is provided from the voltage source 346 through a resistor 380 and the attenuator gain is adjusted by means of a variable resistor 382 in series with a resistor 384 connected to the resistor 374. The output current from the attenuator passes through a resistor 386 connected to a current select switch (not shown).

Referring to FIG. 11, in the system of FIG. 5, for example, the output of the current attenuator of FIG. 10 is applied to the current select switch 240. Resistors 386 and 386' are part of the current attenuator 238 and 248, respectively, and are connected to input terminals of the current select switch 240. Resistor 386 is connected by means of the line 388 to the anodes of diodes 400 and 402. Resistor 386' is likewise connected to the anodes of diodes 404 and 406. The switching diodes 400 and 404 are common to the emitter of transistor 294. The steering diodes 402 and 406 are connected to the gating logic to control the current through the steering diodes. Diodes 400, 402, 404 and 406 are matched Schottky barrier devices.

The gating logic includes an OR/NOR function gate 408 having the OR output tied to the diode 402 and the NOR output tied to the diode 406. The gate 408 is pulsed at half the full conversion rate by a clock/2 pulse on a line 410. A bias voltage is generated in the clock logic by resistors 411–413.

When the clock/2 signal on the line 410 becomes a logic ONE, the steering diode 402 is back biased permitting current from source (A) to flow into the emitter branch of the transistor 294, and ultimately to the summing node 208 connected to the collector electrode of the transistor 294, by means of a line 416. Since at this time the clock/2 signal at the output of the gate 408 is logic ZERO, the current from source (B) is diverted through the steering diode 406 into the gating logic.

When the clock/2 pulse on the line 410 becomes a logic ZERO, the reverse operation takes place with the current from source (B) flowing into the emitter branch of the transistor 294 and the current from source (A) flowing through the steering diode 402 into the gating logic.

The linear common-base amplifier coupling cathodes of diodes 400 and 404 to line 416 and the summing node 208 are identical to the circuit described in FIG. 9. The current output from the collector electrode of the transistor 294 is applied by means of the line 416 to the summing node 208 that also has applied thereto the fine analog current increment from the current attenuator 224 and a coarse analog current from the equal weighted current switch 204. The summing node 208 is also connected to a temperature compensated voltage source 422. Thus, the combined current on the line 424 is the input to the amplifier 254 of FIG. 5.

Figure 12:
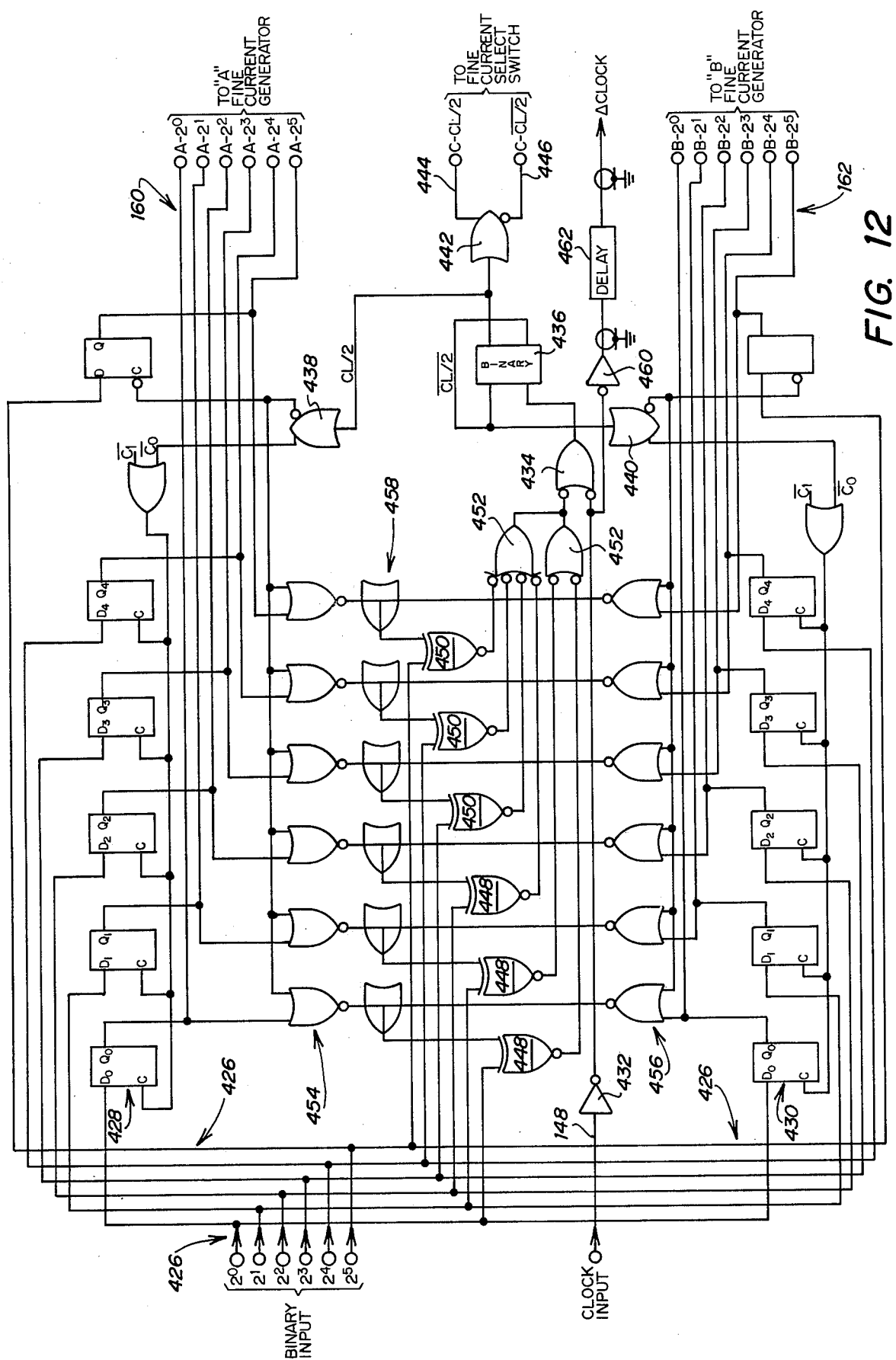
FIG. 12 is a logic diagram of a presettling input demultiplexer for use with the uniformalized digital-to-analog converter of FIG. 3.

Referring to FIG. 12, there is shown a logic diagram of the presettling input demultiplexer 146 of FIG. 3. The demultiplexer 146 of FIG. 3 performs four logic functions: (1) if the binary input to be converted is different from the previously converted binary input, the new input is stored; (2) the demultiplexer compares the binary input to be converted with the previously converted input and when the two inputs are equal, the comparator inhibits the conversion function since no change is required in the output; (3) the demultiplexer 146 provides timing, such that, adjacent binary inputs that are numerically different are applied to identical circuits. When the "fine" analog current is selected and applied to the current select switch 172 the corresponding digital input is latched in storage and identical circuits are made available for the next binary input. Fourth, the demultiplexer applies the binary inputs to the fine binary weighted current switch that is not in use, to provide the converter output, regardless of the numerical value of the binary inputs.

A six bit binary input (typical) is applied to the demultiplexer over lines 426 to three separate logic circuits. The array of flip-flops 428 in the upper half of the figure provides storage of a binary input to be applied to the binary weighted current switch 164 over the lines of channel 160. The array of flip-flops 430 in the lower half of the figure are identical to the array 428 and provide storage for the binary input to be transferred to the binary weighted current switch 166 over lines of the channel 162.

Clock pulses on the line 148 at the full conversion rate are applied to an inverter amplifier 432 having an output connected to a NOR gate 434. The NOR gate 434 in turn is connected to clocking logic 436 that counts the input clock cycles for different adjacent binary inputs. The output of the logic 436 controls which current switch 164 or 166 is to be used for the fine analog current increment to be summed at the summing node 158, and which circuit is to process the next binary input. These functions are controlled by clock pulses from binary 436.

One output of the logic 436 is the clock/2 pulse applied to a gate 438 having an OR output and a NOR output for clocking the flip-flop array 428. A second output of the logic 436 is the clock/2 pulse applied to a gate 440 having an OR output and a NOR output for controlling the flip-flop array 430. Also connected to receive the clock/2 pulse is a gate 442 having a C-clock/2 output pulse on a line 444 and a C-clock/2 pulse on a line 446.

Assuming the clock/2 output of the logic 436 is at logic ZERO, then the clock signal on the line 446 from the gate 442 is at logic ONE which selects channel B and couples the output of the current switch 166 through the current select switch 172 to the summing node 158. In addition, for this state, the present binary input is stored in the flip-flop array 430 and the flip-flop array 428 is ready to be loaded with the next incoming binary intput and in turn applied to the current switch 164. This incoming binary input is converted in the current switch 164 and allowed to presettle before the next clock cycle.

If the most recent binary input data is different numerically from the previous input, comparator logic including Exclusive OR gates 448 and 450 and NOR gates 452 enable the clock signal to pass through the gate 434 to the counter 436. The clock/2 output of the counter 436 becomes a logic ONE with the next clock event, which causes the current output of the switch 164 (presettled) to be switched to the summing node 158 through the current select switch 172. The next input word is then stored in the flip-flop array 428 while the previous binary data is settling in the flip-flop array 430.

Output data from the flip-flop array 428 is also gated to NOR gates 454 to be the reference for the next binary input. As mentioned, the flip-flop array 430 accepts the next binary input, and if numerically different, the response as described continues. When the binary input stored in the flip-flop array 430 is converted in the switch 166 and applied to the summing node 158, the output of these flip-flops is also applied to NOR gates 456 for use as the reference for the next word stored in the flip-flop array 428. This reference code from the NOR gates 454 or 456 is compared with the binary input at the Exclusive OR gates 448 and 450 through wired OR 458.

Also generated in the demultiplexer 146 is a Δ clock pulse applied to the storage elements of the binary coded linear scale translator 150. The Δ clock pulse is generated at the output of an inverter amplifier 460 after passing through a delay line 462. The Δ clock pulse occurs with every conversion since the translator 150 operates at the full conversion rate. The delay time is required to synchronize coarse and fine current at the summing node.

Referring to FIG. 13, there is shown an analog-to-digital converter using the parallel processing technique of the present invention. An analog input voltage is applied to one terminal of a linear differential amplifier 464 with a second input as a calibration or test voltage. The noninverted output of the amplifier 464 is continuously available to a linear scale comparator 466 through a linear isolation amplifier 468. The isolation amplifier 468 comprises an array of parallel connected linear amplifiers 470 each providing an individual output current to a separate terminal of the comparator 466. The comparator 466 comprises an array of latches 472 equal in number to the amplifiers 470. An output of each of the amplifiers 470 is coupled to the corresponding latches 472 through a comparator amplifier 474. Each latch 472 of the comparator 466 senses a voltage level greater than a reference voltage applied to the second input of the corresponding differential amplifier 474.

The reference voltage to each of the flip-flops 472 is established in a ladder network comprising resistors 476 grounded at one end and connected to a reference voltage generated at a Zener diode 478 tied to a voltage source through a current limiting resistor 480. The various interconnections of the resistors 476 establish the reference voltages of the ladder network which are compared with the input to the amplifier 474 generated at the output of the amplifier 470. The voltage output of each of the amplifiers 470 is established by a resistor connected to the output terminal and a voltage supply, such as resistors 482–485.

When a clock pulse occurs at each of the flip-flops 472, a coarse measure of the input analog is taken at the output of each of the flip-flops in binary coded linear scale. For purposes of clarification in the drawing, only four of the flip-flops 472 are shown with interconnections to subsequent components.

To encode the fine increments of the input analog, the output of the comparator 466 is applied to a linear scale current switch (LSCS) 486 which converts the binary coded linear scale output of the comparator 466 to a corresponding analog current (having a predictable transient response and setting time) applied to the inverting input terminal of a linear differential amplifier 488. Applied to the noninverting input of the amplifier 488 is the original analog voltage from the noninverting output of the amplifier 464 and delayed through a time delay link 490. The amount of delay introduced into the output of the amplifier 464 equals the response time and settling time of the linear scale current switch 486, and comparator 466.

The difference voltage between the two inputs of the amplifier 488 equals the analog value of the fine increments to be resolved. The output of amplifier 488 is applied to an array of linear inverting isolation amplifiers 492 similar to the isolation amplifiers 468. The plurality of outputs of the amplifiers 492 are applied to a linear scale comparator 494 for generating a binary coded linear scale output to a linear scale-to-binary translator 496. When the comparator 494 is clocked by a pulse on the line 498, the output of the translator 496 represents the four least significant bits of a binary coded output.

The most significant bits (coarse) of the binary code are generated by applying the output of the comparator 466 to the input of a linear scale-to-binary translator (LSBT) 500 comprising an array of logic NOR gates 502 interconnected to provide four binary bits on lines 504. Each of the bits on the lines 504 are transferred into a corresponding flip-flop 506 for storage and thus synchronized with the least significant outputs of the comparator 494. When the comparator 494 is clocked, the translated coarse increments in the binary storage flip-flops 506 are clocked by a pulse on a line 508; and hence, synchronized with the four bits of the translator 496 to form an eight bit binary code as an output on the lines 510.

Synchronously with the clock cycle of comparator 494 and the binary storage flip-flops 506, a new sample is taken in the lienar scale comparator 466 to repeat the cycle. A new binary output is then generated for each clock pulse on the lines 498, 508 and to comparator 466.

Only two parallel channels have been illustrated in FIG. 13 in the analog-to-digital converter; it should be understood that additional channels may be paralleled with the two shown to increase the conversion rate. One additional channel would provide conversion for fine increments of the binary output, coarse increments of the output and intermediate increments, such as the digital-to-analog converter of FIG. 5.

While several embodiments of the invention, together with modifications thereof, have been described in detail herein and shown in the accompanying drawings, it will be evident that various further modifications are possible without departing from the scope of the invention.

What is claimed is:

1. A uniformalized digital-to-analog converter, comprising in combination:

a digital translator responsive to the most significant bits of an input and generating a binary coded linear scale output, first storage means connected to said translator for storing the binary scale output and responsive to a clock pulse, a first current switch connected to said first storage menas and responsive to the stored binary code of said translator and producing a current output varying with the input, second storage means for storing the least significant bits of the input and responsive to a clock pulse, a second current switch responsive to the least significant bits in said second storage means and generating a current output varying with the input thereto, third storage means for storing the least significant bits of the input and responsive to a clock pulse, a third current switch responsive to the least significant bits of the input in said third storage means and generating an output current varying with the input thereto, means for summing the current output of said first current switch alternately with the current output of the second current switch and the third current switch into a total current varying with the most significant and least significant bits of an input, a current select switch having one input from said second current switch and a second input from said third current switch alternately coupling one of the input currents to said menas for summing, and means for generating clock pulses to said first, second and third storage means to synchronize the summing of the current output of said first, second and third current switches.

2. A uniformalized digital-to-analog converter as set forth in claim 1 wherein said means for generating clock pulses includes means for providing clock pulses to said third storage means and to said current select switch.

3. A uniformalized digital-to-analog converter as set forth in claim 1 wherein said second and third current switches comprise binary weighted current switching devices.

4. A uniformalized digital-to-analog converter as set forth in claim 3 wherein said second and third current switches further include means for scaling the least significant current bits to "fit" (interpolate) the most significant bits.

5. A uniformalized digital-to-analog converter as set forth in claim 1 including storage means connected to the input of said digital translator and responsive to clock pulses from said means for generating to deskew the most significant input bits due to different propogation delays at the input interface.

6. A uniformalized digital-to-analog converter, comprising in combination:
a digital translator responsive to the most significant bits of an input and generating a binary coded linear scale output,
a first current switch responsive to the binary coded linear scale output of said translator and producing a current output varying with the input,
a second current switch for receiving the least significant bits of the input and generating a current output varying with the input thereto,
a third current switch for receiving the least significant bits of the input and generating a current output varying with the input thereto,
a demultiplexer connected to receive the least significant bits of the input for alternately applying such bits to the second or third current switch,
a current select switch having one input from said second current switch and a second input from said third current switch for alternately coupling one of the input currents to an output line, and
means for summing the current output of said first current switch with the current output of said current select switch on the output line into a total current varying with the most significant and least significant bits of the input.

7. A uniformalized digital-to-analog converter as set forth in claim 6 including means for generating clock pulses to said demultiplexer to control the switching of the input bits to the second and third current switches.

8. A unifomalized digital-to-analog converter as set forth in claim 6 wherein said demultiplexer includes means for storing the binary input data bits and for applying the stored bits to said second and third current switches.

9. A uniformalized digital-to-analog converter as set forth in claim 8 wherein said demultiplexer further includes:
means for comparing the most recent input data bits with the previously stored input data bits, and
means for inhibiting the conversion of the most recent input data when a comparison indicates an equality with the stored data bits.

10. A uniformalized digital-to-analog converter as set forth in claim 6 wherein said demultiplexer includes means for alternately applying the input data to the second or third current switch on the basis of the previous transfer of data.

11. A uniformalized digital-to-analog converter as set forth in claim 6 wherein said demultiplexer includes means for generating clock pulses to said first current switch and to said current select switch to synchronize the transfer of current to said means for summing.

12. A uniformalized digital-to-analog converter as set forth in claim 6 wherein said first, second and third current switches include a temperature stabilized common base amplifier.

13. A uniformalized digital-to-analog converter as set forth in claim 6 wherein said first current switch is a linear scale current switch and said second and third current switches are binary weighted current switches.

14. A uniformalized digital-to-analog converter, comprising in combination:
a first digital translator responsive to the most significant bits of an input and generating a binary coded linear scale output,
a first current switch responsive to the binary coded linear scale output of said first translator and producing a current output varying with the input thereto,
a second digital translator responsive to the least significant bits of an input and generating a binary coded linear scale output,
a second current switch responsive to the binary coded linear scale output of said second translator and producing a current output varying with the input,
a third current switch responsive to the input bits other than those applied to said first and second translators and generating a current output varying with the input thereto, and
means for summing the current output of said first current switch with the output of the second and third current switches into a toal current varying with the total of the digital input.

15. A uniformalized digital-to-analog converter as set forth in claim 14 including a fourth current switch also responsive to the input bits not connected to said first and second translators and generating a current output varying with the input thereto, and
a current select switch having one input from said third current switch and a second input from said fourth current switch for alternately coupling one of the input currents to said means for summing.

16. A uniformalized digital-to-analog converter as set forth in claim 15 including first storage means interconnected between said first translator and said first current switch and second storage means interconnected between said second translator and said second current switch, said storage means for storing the binary scale output applied thereto to synchronize the summing of the current outputs of the first, second, third and fourth current switches.

17. A uniformalized digital-to-analog converter as set forth in claim 16 including means for providing clock pulses to said first and second storage means and to said current select switch.

18. A uniformalized digital-to-analog converter as set forth in claim 14 wherein said second current switch includes means for scaling the output thereof to the output of the first current switch, and
said third current switch includes means for scaling the output thereof to the output of the first current switch.

19. A uniformalized digital-to-analog converter, comprising in combination:
a first digital translator responsive to the most significant bits of an input and generating a binary coded linear scale output,
first storage means connected to said translator for storing the binary scale output and responsive to a clock pulse,
a first current switch connected to said first storage means and responsive to the stored binary code of said first translator and producing a current output varying with the input,
a second digital translator responsive to the least significant bits of an input and generating a binary coded linear scale output,
second storage means connected to said second translator for storing the binary coded output thereof and responsive to a clock pulse,
a second current switch connected to said second storage means and responsive to the stored binary code of said second translator and producing a current output varying with the input thereto,
thrid storage means for storing information input bits other than those connected to said first translator or said second translator and producing a current output varying with the input thereto,
a third current switch responsive to the information bits in said third storage means and generating a current output varying with the input thereto,
means for summing the current output of said first current switch with the current output of the second and third current switches into a total current varying with the combined input information bits, and
means for generating clock pulses to said storage means to synchronize the summing of the current outputs of said current switches.

20. A uniformalized digital-to-analog converter as set forth in claim 19 including fourth storage means for storing infomation bits other than those connected to said first and second translators and responsive to a clock pulse,
a fourth current switch responsive to the information bits of the input in said fourth storage means and generating an output varying with the input thereto, and
a current select switch having one input from said third current switch and a second input from said fourth current switch for alternately coupling one of the input currents to said means for summing.

21. A uniformalized digital-to-analog converter as set forth in claim 20 wherein said means for generating clock pulses includes means for providing clock pulses to said fourth storage means and to said current select switch.

22. A uniformalized digital-to-analog converter as set forth in claim 20 wherein said second current switch includes means for scaling the output thereof to the output of the first current switch, and
said third and fourth current switches include means for scaling the output thereof to the output of the first current switch.

23. A uniformalized digital-to-analog converter as set forth in claim 20 including first storage means connected to the input of said first digital translator and responsive to clock pulses to deskew the most significant input bits due to irregular delays at the input interface,
second storage means connected to the input of said second digital translator and responsive to clock pulses from said means for generating to deskew the least significant input bits due to irregular delays at the input interface,
third storage means connected to the input of said third current switch and responsive to clock pulses from said means for generating to deskew the information bits connected to said third switch with respect to other information bits of the binary coded input, and
fourth storage means connected to the input of said fourth current switch and responsive to clock pulses from said means for generating to deskew the information bits connected to said fourth switch.

24. A uniformalized digital-to-analog converter as set forth in claim 19 wherein said first and second digital translators are binary-to-binary converters.

25. A uniformalized digital-to-analog converter as set forth in claim 24 wherein said first and second current switches are equal weighted current switches.

26. A uniformalized digital-to-analog converter as set forth in claim 20 wherein said third and fourth current switches are binary weighted current switches.

27. A uniformalized digital-to-analog converter, comprising in combination:
a binary-to-binary translator responsive to the most significant bits of an input for generating a binary coded linear scale output,
a first current select switch responsive to the binary coded linear scale output of said translator and producing a current output varying with the input,
a second current switch responsive to the least significant bits of the input and generating a current output varying with the input thereto,
a third current switch also responsive to the least significant bits of the input and generating a current output varying with the input thereto,
a current select switch having one input from said second current switch and a second input from said third current switch for alternately coupling one of the input currents to an output of said current select switch, and means for summing the current output of said first current switch with the current output of the current select switch into a total current varying with the most significant and least significant bits of the input.

28. A uniformalized digital-to-analog converter as set forth in claim 1 including storage means interconnected between said translator and said first current switch for storing the binary scale output to synchronize the summing of the current output of the first and second current switches.

29. A uniformalized digital-to-analog converter as set forth in claim 28 including means for providing clock pulses to said storage means and said current select switch.

* * * * *

UNITED STATES PATENT OFFICE
CERTIFICATE OF CORRECTION

Patent No. 4,016,555            Dated      April 5, 1977

Inventor(s)    Sylvan F. Tyrrel

It is certified that error appears in the above-identified patent and that said Letters Patent are hereby corrected as shown below:

Column 4, line 23, "output" should read -- input --.

Column 6, line 19, after "84" insert --, --; line 55, "bact" should read -- back --.

Column 7, line 2, "$\overline{clock/2}$" should read -- clock/2 --; line 3, "clock/2" should read -- $\overline{clock/2}$ --; line 11, "lood" should read -- look --.

Column 8, line 25, "A" should read -- At --.

Column 11, line 33, "to" first occurrence should read -- by --.

Column 12, line 29, "resistor" should be -- register --.

Column 14, line 45, "clock/2" should read -- $\overline{clock/2}$ --; line 49, "C-clock/2" should read -- $\overline{C\text{-}clock/2}$ --;

line 59, "intut" should read -- input --.

Column 16, line 68, "menas" should read -- means --.

UNITED STATES PATENT OFFICE
CERTIFICATE OF CORRECTION

Patent No. 4,016, 555          Dated April 5, 1977

Inventor(s) Sylvan F. Tyrrel

It is certified that error appears in the above-identified patent and that said Letters Patent are hereby corrected as shown below:

Column 17, line 23, "menas" should read -- means --.

Column 21, line 9, "Claim 1" should read -- Claim 27 --.

Signed and Sealed this twelfth Day of July 1977

[SEAL]

Attest:

RUTH C. MASON
*Attesting Officer*

C. MARSHALL DANN
*Commissioner of Patents and Trademarks*